(12) United States Patent
Takano et al.

(10) Patent No.: US 8,704,337 B2
(45) Date of Patent: Apr. 22, 2014

(54) SEMICONDUCTOR DEVICE AND METHOD FOR MANUFACTURING THE SAME

(75) Inventors: Eiji Takano, Kanagawa-ken (JP); Hideo Numata, Kanagawa-ken (JP); Kazumasa Tanida, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 90 days.

(21) Appl. No.: 12/880,838

(22) Filed: Sep. 13, 2010

(65) Prior Publication Data
US 2011/0073974 A1    Mar. 31, 2011

(30) Foreign Application Priority Data
Sep. 28, 2009  (JP) .................. P2009-221978

(51) Int. Cl.
*H01L 23/00*  (2006.01)
*H01L 31/0232*  (2006.01)

(52) U.S. Cl.
USPC ............ 257/620; 257/432; 257/680; 438/116

(58) Field of Classification Search
USPC .................. 257/432, 620, 680, 684, E21.26, 257/E31.121; 438/68, 116
See application file for complete search history.

(56) References Cited

U.S. PATENT DOCUMENTS

| | | | |
|---|---|---|---|
| 6,800,551 B2* | 10/2004 | Nagahara et al. ............ | 438/638 |
| 7,193,289 B2* | 3/2007 | Adkisson et al. ............ | 257/431 |
| 7,767,485 B2* | 8/2010 | Ogawa et al. ................ | 438/65 |
| 7,867,825 B2* | 1/2011 | Kim et al. .................... | 438/113 |
| 7,939,913 B2* | 5/2011 | Watanabe et al. ............ | 257/620 |
| 8,076,837 B2* | 12/2011 | Im et al. ....................... | 313/504 |
| 2006/0001156 A1* | 1/2006 | Wakiyama et al. .......... | 257/737 |
| 2006/0234499 A1* | 10/2006 | Kodera et al. ............... | 438/641 |
| 2007/0052352 A1* | 3/2007 | Im et al. ....................... | 313/506 |
| 2007/0080418 A1* | 4/2007 | Ryu .............................. | 257/459 |
| 2008/0042227 A1* | 2/2008 | Asano et al. ................. | 257/432 |
| 2008/0290435 A1* | 11/2008 | Oliver et al. ................. | 257/432 |

(Continued)

FOREIGN PATENT DOCUMENTS

| | | |
|---|---|---|
| JP | 2004-207461 | 7/2004 |
| JP | 2007-073958 | 3/2007 |
| JP | 2008-103433 | 5/2008 |
| JP | 2008-130886 | 6/2008 |

OTHER PUBLICATIONS

Japanese Office Action for Japanese Patent Application No. 2009-221978 mailed on Jan. 31, 2012.

(Continued)

*Primary Examiner* — Allan R Wilson
(74) *Attorney, Agent, or Firm* — White & Case LLP (57) ABSTRACT

In one embodiment, a method for manufacturing a semiconductor device includes following steps. An aperture is formed in an interlayer insulating film formed on a semiconductor wafer apart from an integrated circuit portion by etching process. The interlayer insulating film has a dielectric constant smaller than a silicon oxide film ($SiO_2$), and the width of the aperture is larger than a dicing region. A resin layer is embedded in the aperture. An adhesive layer is formed on the interlayer insulating film and the resin layer. The semiconductor wafer is attached to a glass substrate using the adhesive layer by Face Down method. The semiconductor wafer, the resin layer, and the adhesive layer on a dicing region are cut by blade dicing. The semiconductor wafer and the glass substrate adhered to the semiconductor wafer are cut into pieces by the blade dicing of the glass substrate under the dicing region.

13 Claims, 14 Drawing Sheets

(56) References Cited

U.S. PATENT DOCUMENTS

2009/0263927 A1* 10/2009 Lin et al. .................. 438/66
2010/0283129 A1* 11/2010 Tetani et al. ................ 257/620
2012/0126404 A1* 5/2012 Wakiyama et al. ......... 257/737

OTHER PUBLICATIONS

Japanese Office Action for Japanese Patent Application No. 2009-221978 mailed on Sep. 24, 2012.

* cited by examiner

SEMICONDUCTOR DEVICE AND METHOD FOR MANUFACTURING THE SAME

CROSS-REFERENCE TO RELATED APPLICATION

This application is based upon and claims the benefit of priority from prior Japanese Patent Application No. 2009-221978, filed Sep. 28, 2009, the entire contents of which are incorporated herein by reference.

FIELD

The embodiments relate to a semiconductor device and a method for manufacturing the same.

BACKGROUND

In recent years, a Low-k insulating film whose dielectric constant is smaller than a silicon oxide film ($SiO_2$) is widely used as an interlayer insulating film for a semiconductor integrated circuit with progress of improvement in integration density, operation speed and low power consumption. The semiconductor devices in which the semiconductor integrated circuit having the Low-k insulating film is formed on a glass substrate are separated into pieces by dicing (for example, refer to a Japanese laid open patent application No. 2007-73958).

In the semiconductor device described in the above-mentioned patent application, the semiconductor devices are separated into pieces, for example, by a blade dicing from a back side of the semiconductor integrated circuit. For this reason, damage occurs in the Low-k insulating film at the time of dicing, and problems such as chipping, cracking, and film breakage at an edge of a semiconductor chip are resulted. Similarly, when a protection film is prepared in a surface of a semiconductor wafer which has a Low-k insulating film in a semiconductor integrated circuit, and the wafer is separated into pieces by the blade dicing from a back surface side of the wafer, problems such as chipping, cracking, and film breakage can occur at the chip edge.

BRIEF DESCRIPTION OF THE DRAWINGS

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION

A semiconductor device and a method for manufacturing the same according to an exemplary embodiment of the present invention will now be described with reference to the accompanying drawings wherein the same or like reference numerals designate the same or corresponding parts throughout the several views.

According to one embodiment, a method for manufacturing a semiconductor device includes: forming an aperture in an interlayer insulating film formed on a semiconductor wafer apart from an integrated circuit portion by etching process, the interlayer insulating film having a dielectric constant smaller than a silicon oxide film ($SiO_2$), and the width of the aperture being broader than a dicing region; embedding a resin layer in the aperture; forming an adhesive layer on the interlayer insulating film and the resin layer; arranging the semiconductor wafer having the adhesive layer on a glass substrate by face down; attaching the semiconductor wafer to the glass substrate by the adhesive layer; cutting the semiconductor wafer, the resin layer, and the adhesive layer on the dicing region by blade dicing; and separating the semiconductor wafer and the glass substrate adhered to the semiconductor wafer into pieces by blade dicing of the glass substrate under the dicing region.

According to another embodiment, a semiconductor device includes a semiconductor chip. The semiconductor chip includes: an interlayer insulating film formed on a semiconductor substrate and having a dielectric constant smaller than a silicon oxide film ($SiO_2$); an aperture portion formed in the interlayer insulating film at an edge of the semiconductor chip apart from a semiconductor element portion; and a resin layer formed so as to cover the aperture portion.

First Embodiment

Figure 1:
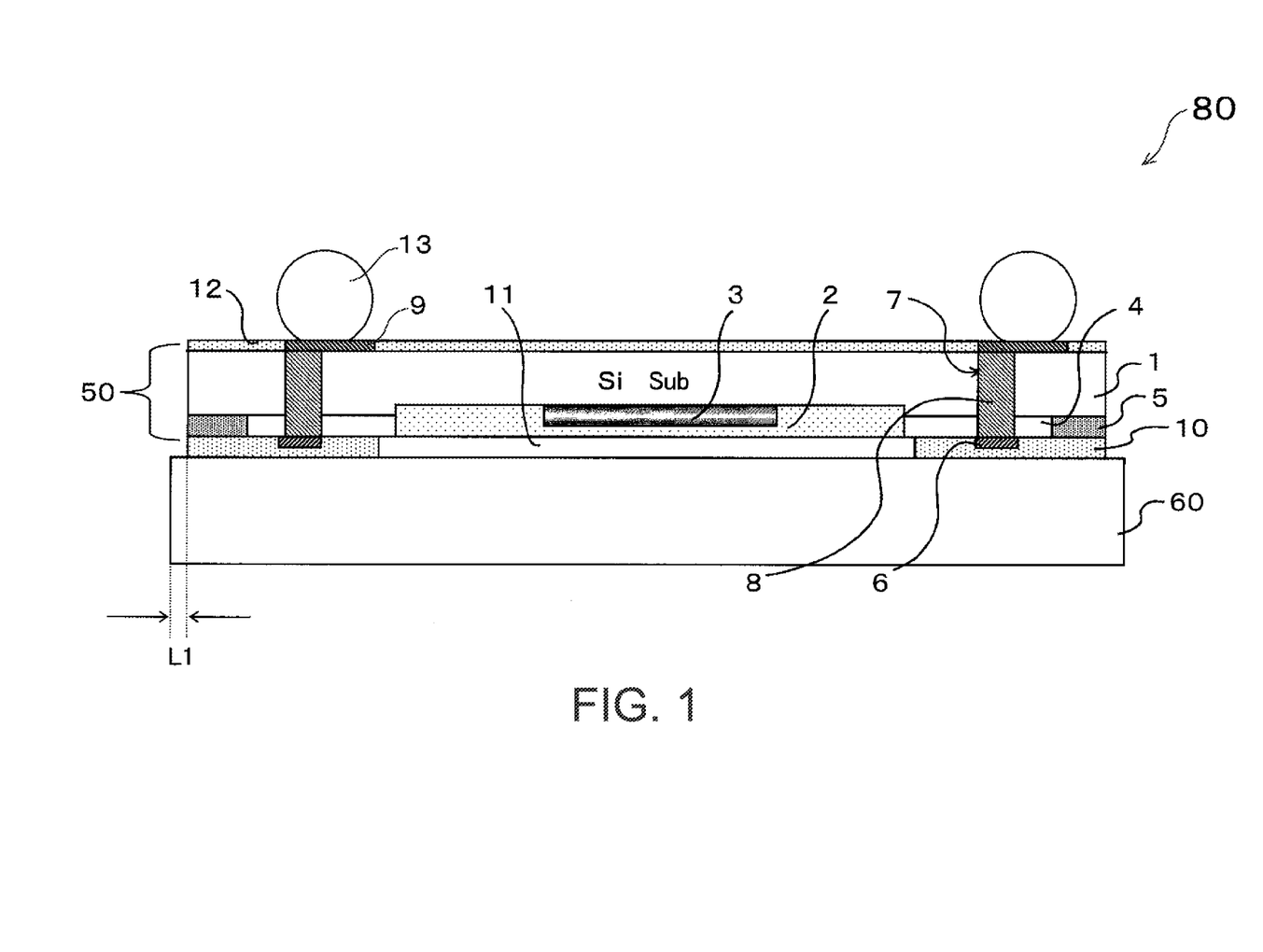
FIG. 1 is a cross-sectional view showing a semiconductor device according to a first embodiment of the present invention.
Figure 2:
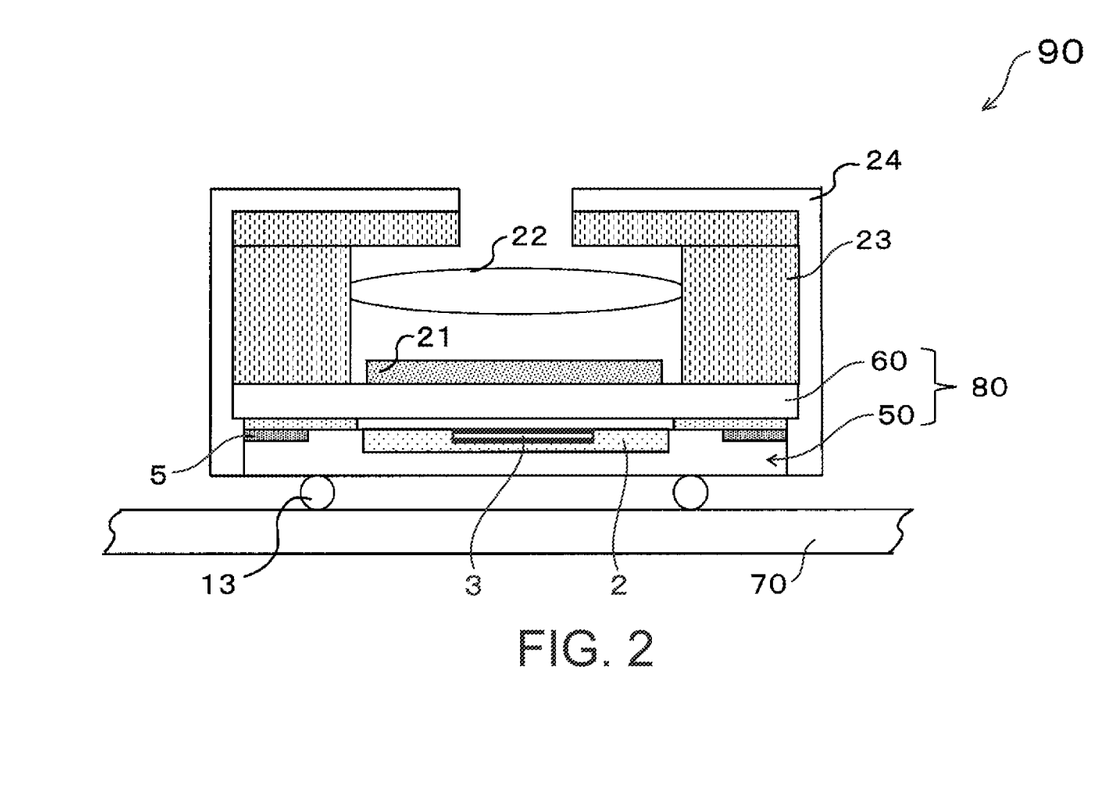
FIG. 2 is a cross-sectional view showing a camera module according to the first embodiment of the present invention.

First, a semiconductor device according to a first embodiment of the present invention and a method for manufacturing the same are explained with reference to the drawings. FIG. 1 is a cross-sectional view showing the semiconductor device according to the first embodiment, and FIG. 2 is a cross-sectional view showing the semiconductor device according to the first embodiment applied to a camera module. In this embodiment, a resin layer is formed in an edge portion of a semiconductor chip to reduce chipping, cracking, and film breakage generated in the semiconductor chip at the time of dicing.

As shown in FIG. 1, a semiconductor device 80 includes a semiconductor chip 50 and a glass substrate 60. In the semiconductor device 80, the semiconductor chip 50 is arranged on the glass substrate 60 by Face Down method, and the semiconductor chip 50 and the glass substrate 60 are attached by an adhesive layer 10.

The semiconductor chip 50 includes a silicon substrate 1, an integrated circuit portion 2, a light sensor portion 3, an interlayer insulating film 4, a resin layer 5, a surface electrode 6, a penetration electrode 8, a back surface electrode 9, a back surface protection film 12, and a ball terminal 13. The semiconductor chip 50 is arranged on the glass substrate 60 so that both edges of the semiconductor chip 50 are apart from by only distance L1 from the respective ends of the glass substrate 60. The semiconductor chip 50 is, for example, a CMOS type image sensor constituted by the integrated circuit portion 2 and the light sensor portion 3.

The integrated circuit portion 2 includes the light sensor portion 3, and is formed in the central portion of the first principal surface of the silicon substrate 1. The interlayer insulating film 4 is formed of a Low-k insulating film having a dielectric constant smaller than a silicon oxide film ($SiO_2$) on the first principal surface of the silicon substrate 1. The resin layer 5 is formed on the first principal surface of the silicon substrate 1 so as to contact with the interlayer insulating film 4 at the edge of the semiconductor chip 50. The resin layer 5 is formed in an aperture portion formed in the interlayer insulating film 4 by etching process.

The surface electrode 6 is formed on the interlayer insulating film 4. The back surface electrode 9 is formed on the second principal surface (back side) on the silicon substrate 1 opposing to the first principal surface. The surface electrode 6 and the back surface electrode 9 are respectively connected with the penetration electrode 8 formed in a through-hole 7 in the silicon substrate 1 by etching process.

The ball terminal 13 is arranged on the second principal surface of the silicon substrate 1 so as to contact with the back surface electrode 9. A back surface protection film 12 is formed on the second surface of the silicon substrate 1 except the back surface electrode 9 and the ball terminal 13. A space portion 11 surrounded by the semiconductor chip 50, the glass substrate 60, and the adhesive layer 10 is formed on the integrated circuit portion 2.

FIG. 2 is a cross-sectional view showing a camera module according to the first embodiment of the present invention. As shown in FIG. 2, an IR cut filter 21, a lens 22 for condensing light, a lens holder 23, a shielding cap 24, a substrate 70, and a semiconductor device 80 are formed in a camera module 90. In addition, although not illustrated, a signal processing IC chip, a power supply IC chip, an input-and-output IC chip, and passive elements, etc. are implemented in the camera module 90.

The lens 22 for condensing light is held by the lens holder 23 and condenses an incident light. The IR cut filter 21 is formed on one surface of the glass substrate 60 opposing to the integrated circuit portion 2 and cuts an infrared region of the condensed incident light. Furthermore, the incident light is irradiated to the sensor portion 3. The shielding cap 24 shields the IR cut filter 21, the lens 22 for condensing, the lens holder 23, and the semiconductor device 80. Various circuits are formed on the substrate 70 and are connected with the ball terminal 13.

Next, a manufacturing method of the semiconductor device is explained with reference to FIGS. 3 to 11. FIGS. 3 to 11 are cross-sectional views showing the manufacturing process of the semiconductor device.

Figure 3:
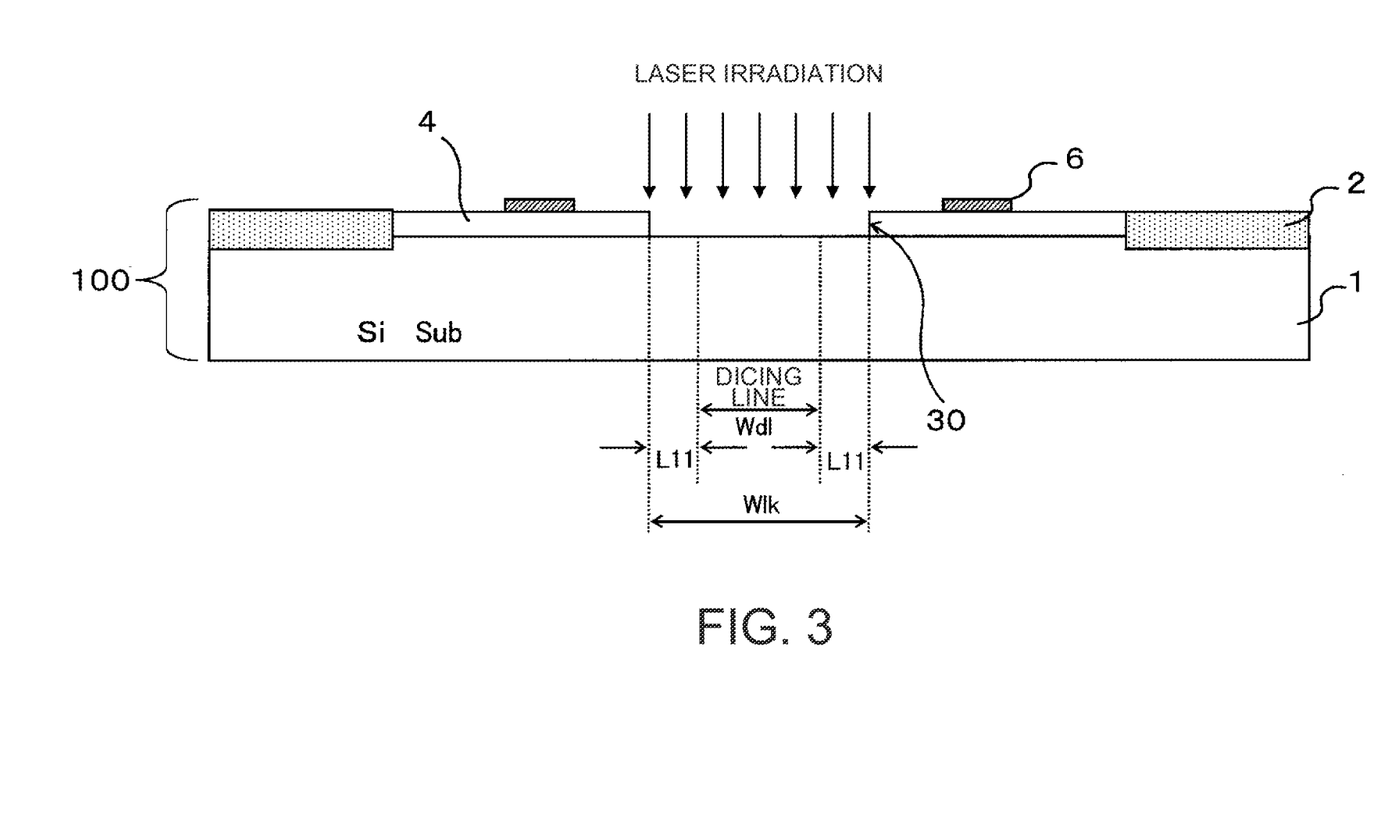
FIG. 3 to FIG. 11 are cross-sectional views showing a manufacturing process of the semiconductor device according to the first embodiment of the present invention.

As shown in FIG. 3, in the semiconductor device 80 constituting the sensor module, an aperture 30 is formed in a region of the interlayer insulating films 4 on the silicon wafer 100 in which a CMOS type image sensor is formed so that the silicon substrate 1 is exposed by irradiating with laser light. The aperture 30 is formed in a region of the interlayer insulating film 4 in which the surface electrode 6 is not formed. Although a SiOC film is used for the interlayer insulating film 4 in this embodiment, other materials such as a SiOCH film, a porous (porosity) silica layer, and etc. may be used instead. Furthermore, although AL (aluminum) is used for the surface electrode 6, other metal such as Cu (copper) etc. may be used instead.

The relation of a laser beam treatment width Wlk, a dicing region width Wdl, and respective distances L11 from both ends of the dicing region in the aperture 30 to the edges of the interlayer insulating film 4 are set as follows.

$$Wlk=Wdl+(2\times L11)$$  Expression (1)

That is, the aperture 30 is formed so as to be apart from the integrated circuit portion 2, and to extend to the inside of the semiconductor chip for distance L 11 from the end of the dicing region.

In the formation method of the aperture 30 using the laser light, for example, a water-soluble protection film is formed on the surface, and UV pulsed laser is used as the laser light. The water-soluble protection film is used to remove solidified residual substance after melted with the UV pulse laser irradiation by water flow. The water-soluble protection film is also removed by the water flow. Here, although the laser light is used for the formation of the aperture 30, RIE (Reactive Ion Etching) etc. may be used instead.

Figure 4:
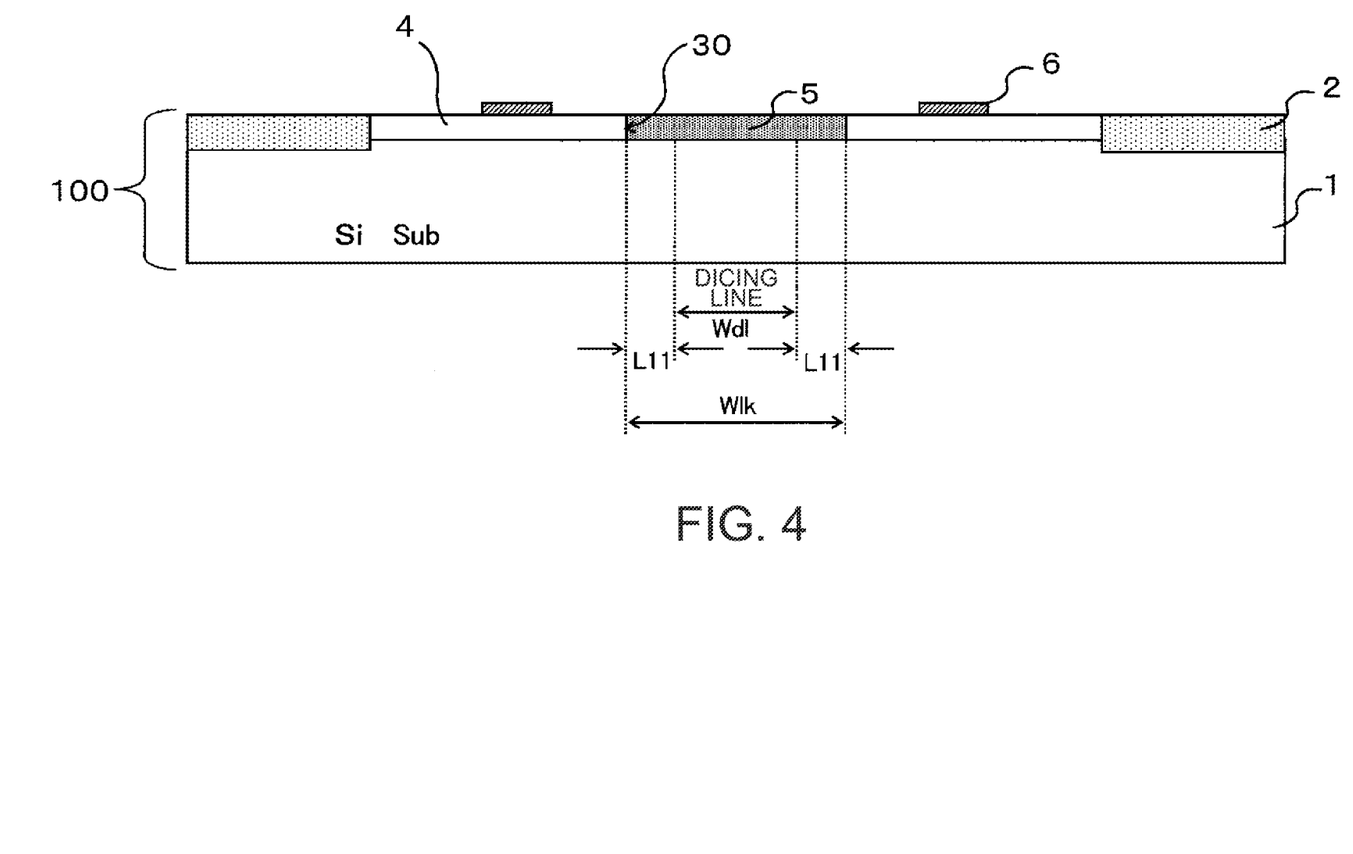
Figure 5:
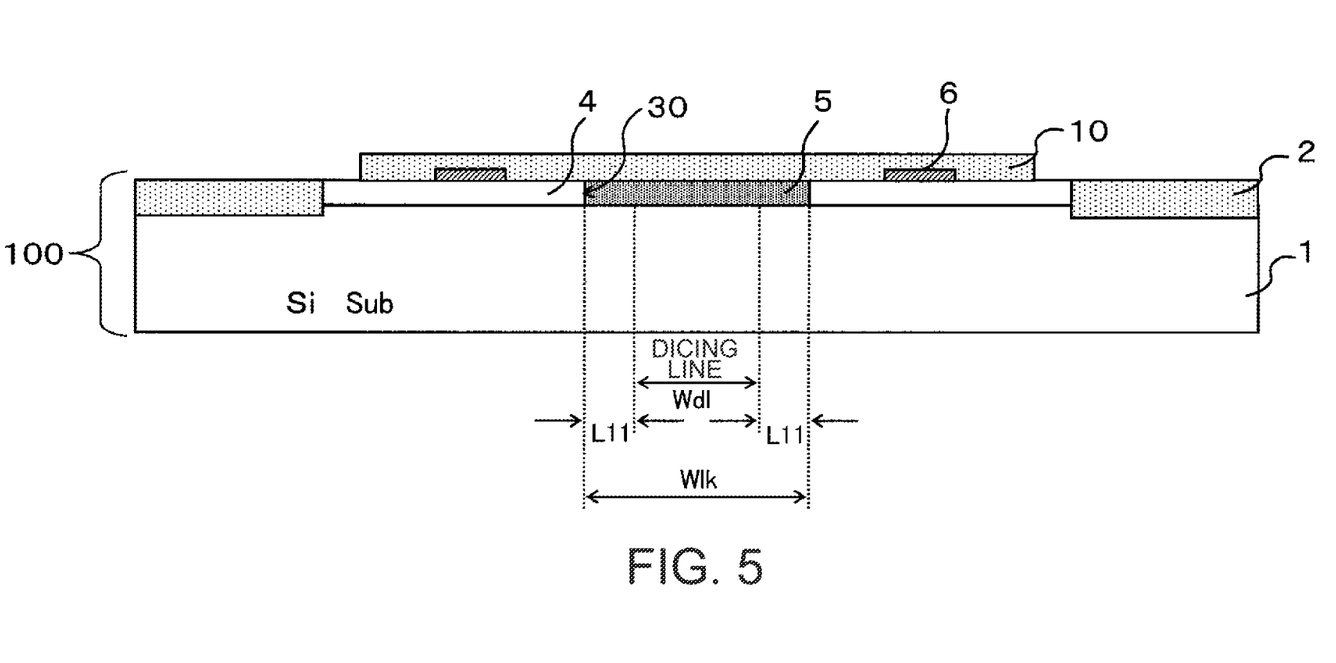

Next, as shown in FIG. 4, the resin layer 5 is formed in the aperture 30. Although polyimide resin is used for the resin layer 5, other resins such as BCB (benzocyclobuten) resin, fluorine resin, and etc. may be used instead. The resin layer 5 is formed to considerably reduce the chipping, the crack, and the broken originated from the edge of the semiconductor chip, specifically, the Low-k insulating film, when the semiconductor chips are separated in pieces by the blade dicing of the silicon wafer 100, Then, as shown in FIG. 5, back surface polishing of the silicon wafer 100 is carried out to make the surface into a mirror surface, and the silicon wafer 100 is formed into a thin wafer. Then, the adhesive layer 10 is formed on the interlayer insulating film 4, the surface electrode 6, and the aperture 30. Although epoxy resin is used for the adhesives 10 in this embodiment, other adhesives such as polyimide resin, acrylic resin, and etc. may be used instead.

Figure 6:
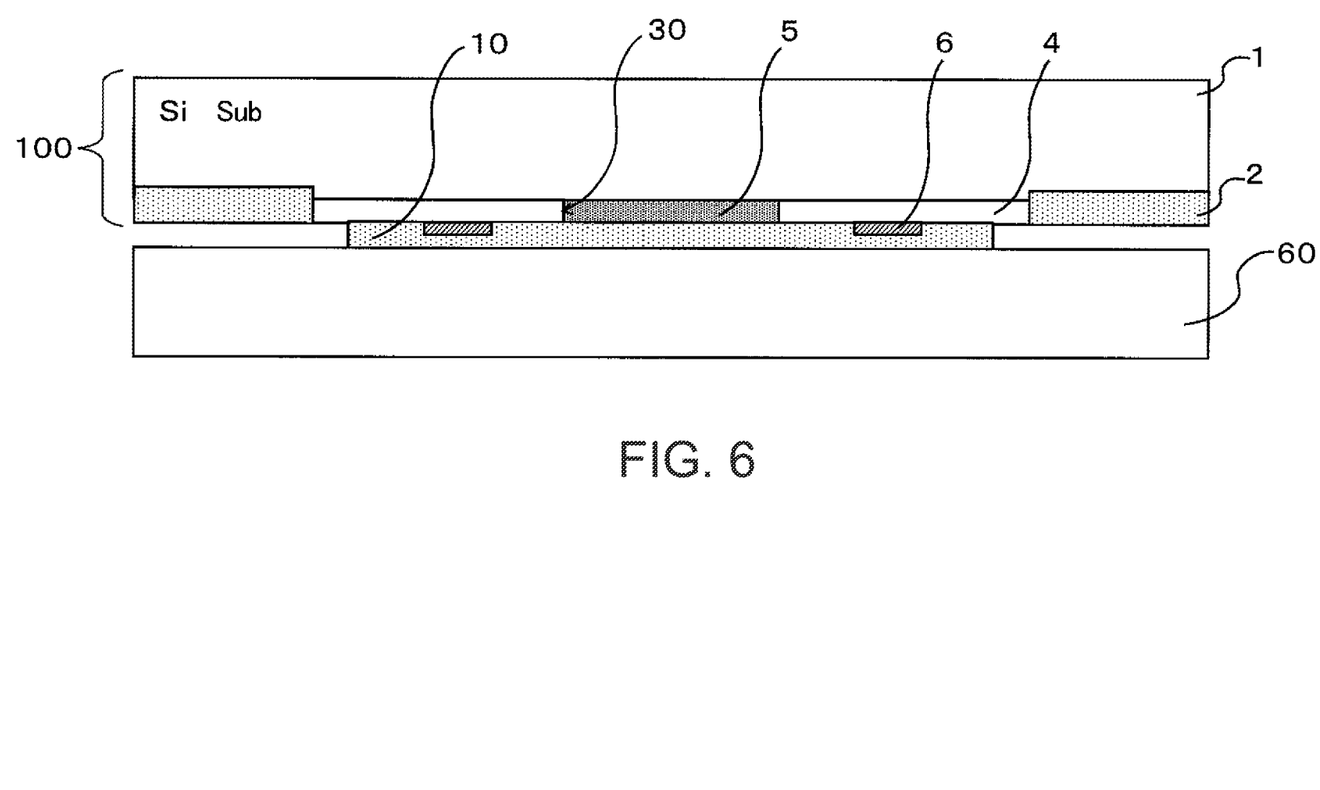

Then, as shown in FIG. 6, the silicon wafer 100 formed into the thin wafer is arranged on the glass substrate 60 by the Face Down method, and the silicon wafer 100 is adhered to the glass substrate 60 by the adhesive layer 10.

Figure 7:
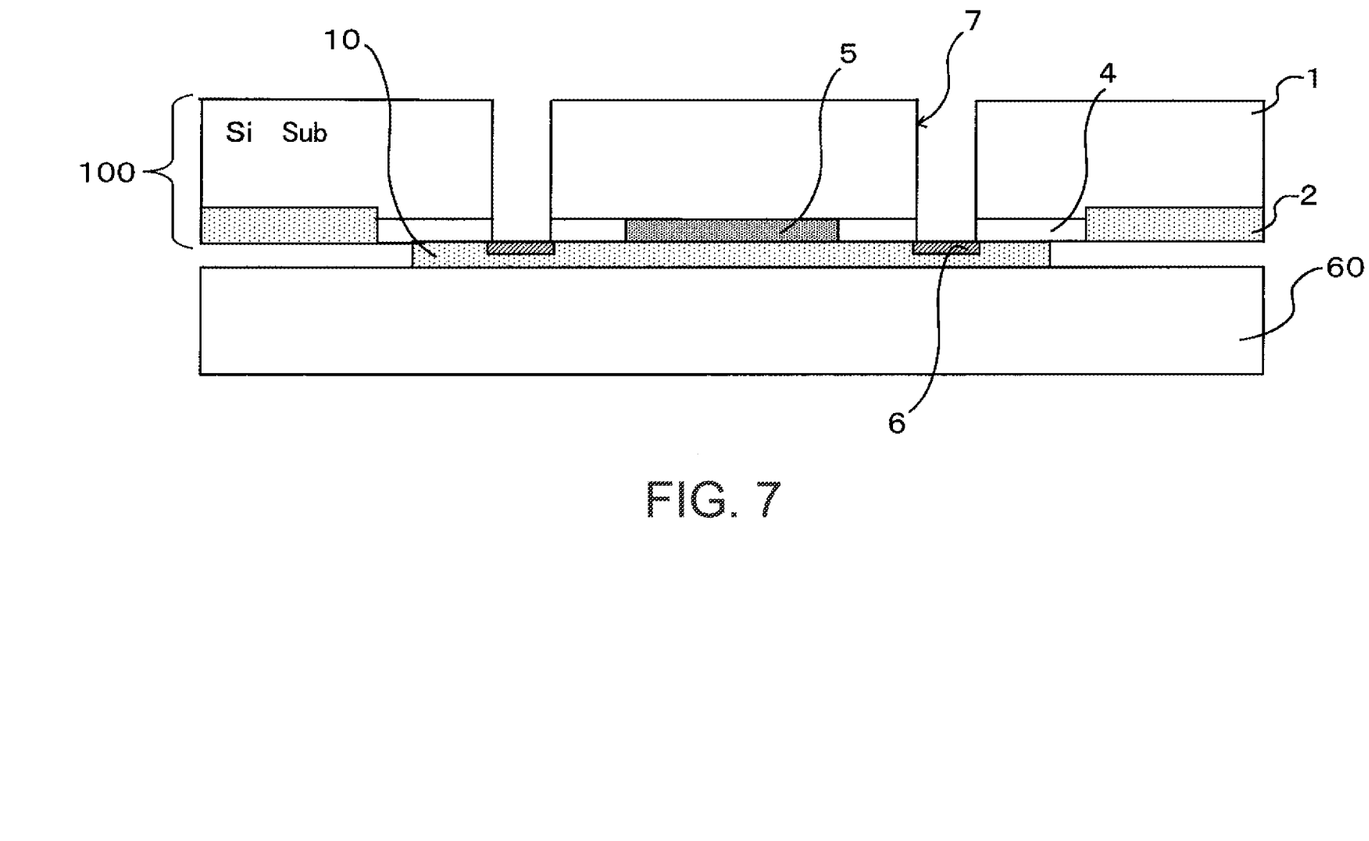

Next, as shown in FIG. 7, the through-hole 7 is formed in the silicon substrate 1 so that the surface electrode 6 may be exposed by etching the silicon substrate 1 and the interlayer insulating film 4 using the Deep RIE method. Practically, the through-hole 7 in an approximately perpendicular shape with a large aspect ratio is formed using the Bosch method in which an etching step by $SF_6$ gas and a deposition process by $C_4F_8$ gas are repeated by turns. RIE post-processing is performed after the Deep RIE processing, and the inner surface of the through-hole 7 is cleaned.

Figure 8:
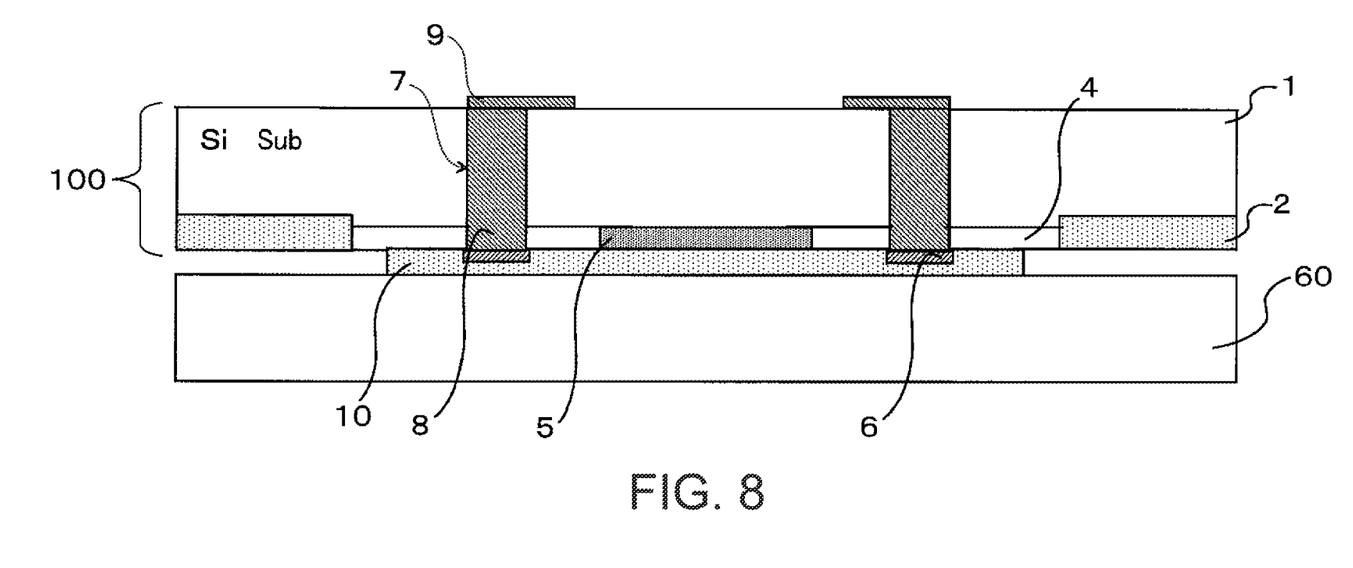

Then, as shown in FIG. 8, the penetration electrode 8 is formed in the through-hole 7 using a plating method. Here, although the electroplating method is used, an electroless plating method etc. may be used. In this embodiment, Cu (copper) is used for the penetration electrode 8, however, other metals such as Ag (silver), nickel (nickel), or Au (gold) may be used instead.

After the penetration electrode 8 is formed, the back surface electrode 9 is formed on the second principal surface (back side) of the silicon substrate 1, for example, using the plating method so as to contact with the penetration electrode 8. Although Cu (copper) is used for the back surface electrode 9 in this embodiment, other metals, such as Au (gold) may be used instead.

Figure 9:
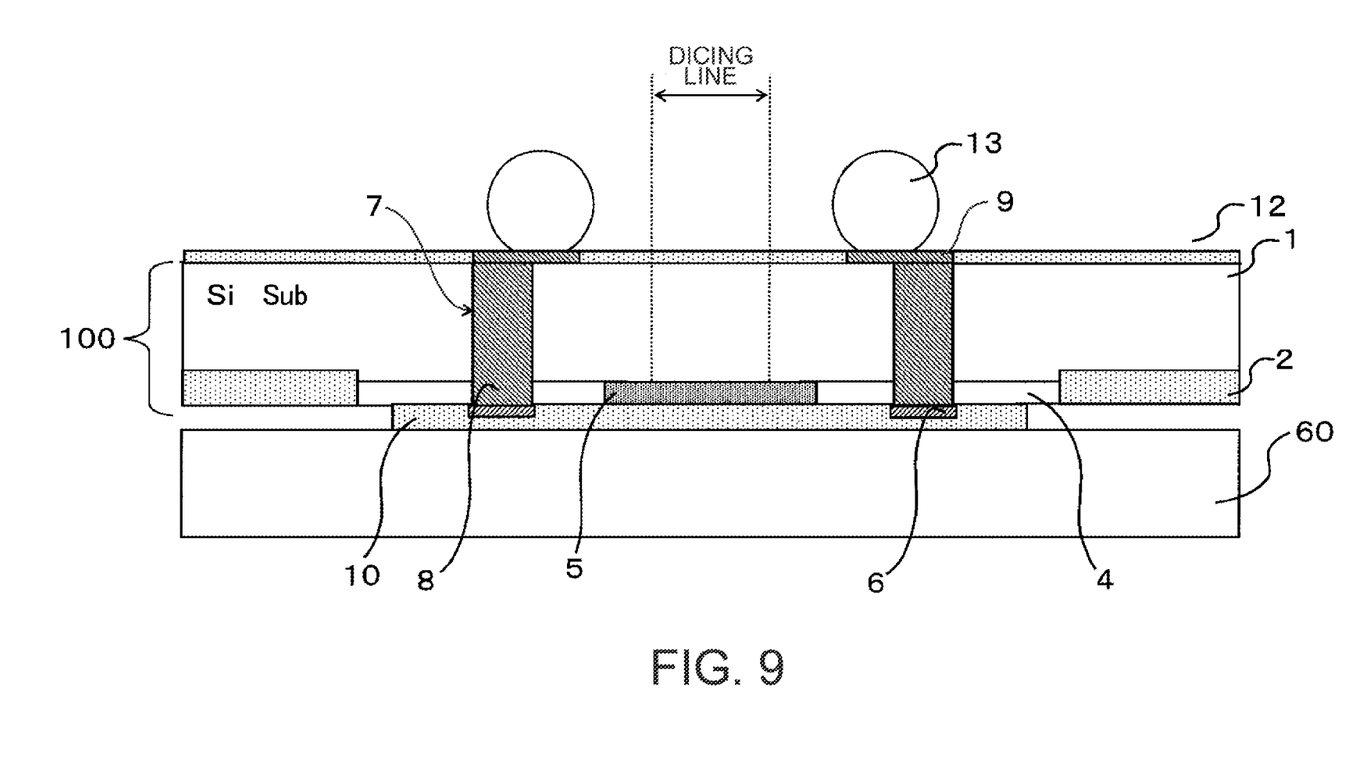

Then, as shown in FIG. 9, the back surface protection film 12 is formed on the second principal surface (back side) of the silicon substrate 1 except the back surface electrode 9. The ball terminal 13 is formed on the back surface electrode 9 after the back protection film 12 is formed. Although solder resist material is used for the back surface protection film 12 in this embodiment, the resins such as polyimide resin, epoxy resin, and etc. may be used instead. Further, Pb (lead) free solder is used for the ball terminal 13, however, other materials such as Au (gold) and etc. may be used.

Figure 10:
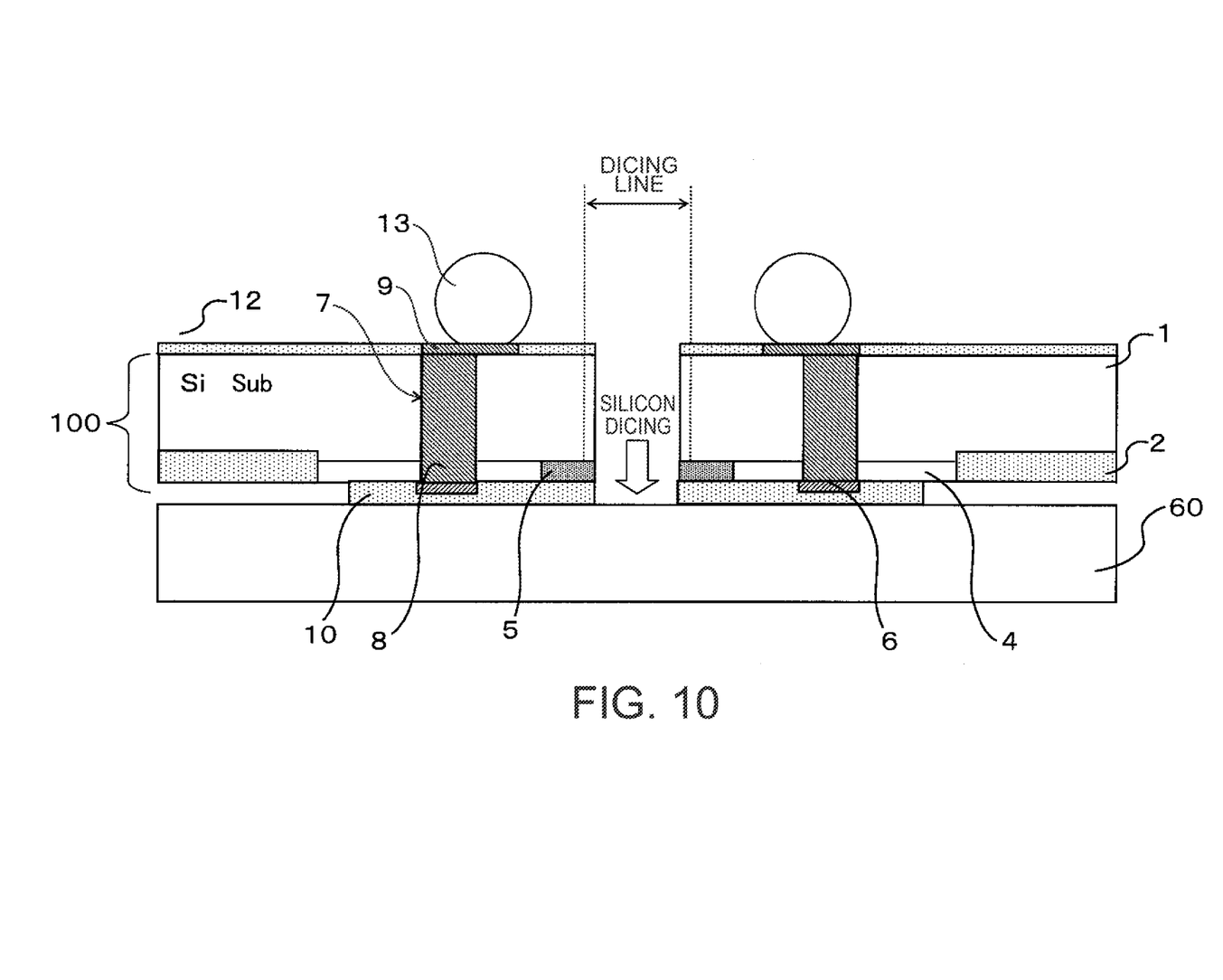

Next, as shown in FIG. 10, the back surface protection film 12, the silicon substrate 1, the resin layer 5, and the adhesive layer 10 on the dicing region are cut by the blade dicing method using a first cutting blade edge. Here, although the cutting is started from X direction, and then Y direction is cut after that, reverse order is possible.

Here, since the interlayer insulating film 4 is arranged apart from the dicing region, the interlayer insulating film 4 is not cut. For this reason, the chipping, the crack or the drop of the interlayer insulating film 4 formed of the Low-K insulating film can be remarkably reduced in the case of cutting by the blade dicing. Moreover, since it is not necessary to make slow the number of rotations of the first cutting blade edge in the blade dicing method, the productivity in the blade dicing process does not fall. In addition, peeling off of the interlayer insulating film 4 formed of the Low-K insulating film by heat stress or medicine damage in the sensor module formation process can be suppressed remarkably.

Figure 11:
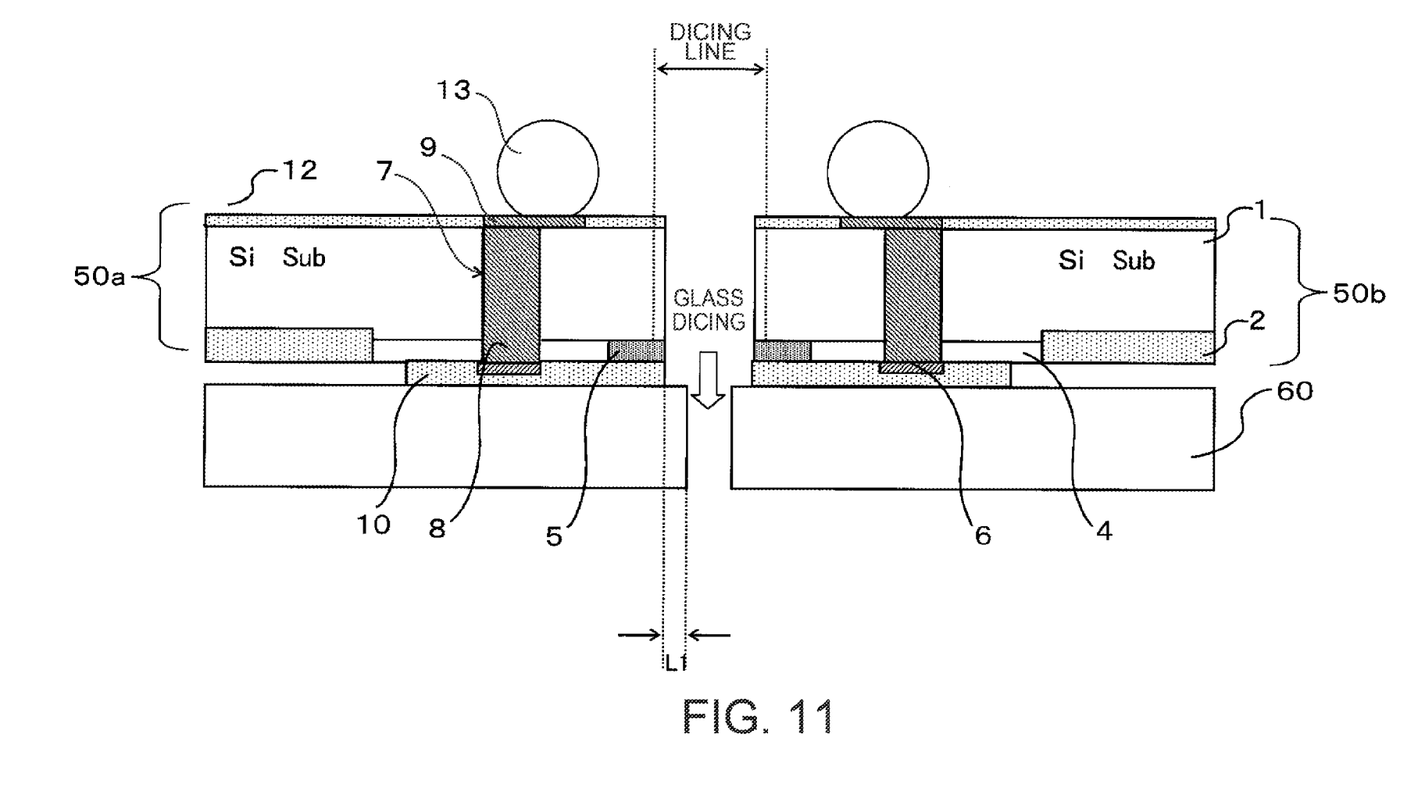

Then, as shown in FIG. 11, the glass substrate 60 under the dicing region is cut by the blade dicing method using a second cutting blade edge. Here, although the cutting is started from X direction, and then Y direction is cut after that, reverse order may be possible. According to the dicing, a plurality of discrete semiconductor devices 80 (refer to FIG. 1), such as a first semiconductor chip 50a and a second semiconductor chip 50b adhered on the glass substrate 60 are formed respectively.

As mentioned above, in the semiconductor device and a manufacturing method for the semiconductor device according to this embodiment, the interlayer insulating film 4 on the silicon wafer 100 in which the integrated circuit portion 2 is formed, is etched to form the aperture 30 broader than the dicing region so as to be apart from the integrated circuit portion 2. The resin layer 5 is embedded in the aperture 30. The silicon wafer 100 is arranged on the glass substrate 60 by the Face Down method and is adhered on the glass substrate 60 by the adhesive layer 10. The silicon wafer 100 adhered to the glass substrate 60 is diced into pieces using the blade dicing method. The back surface protection film 12, the silicon substrate 1, the resin layer 5, and the adhesive layer 10 on the dicing region are cut using the first cutting blade edge. Since the interlayer insulating film 4 is arranged apart from the cutting region, the interlayer insulating film 4 is not cut. The glass substrate 60 under the dicing region is cut by the blade dicing method using the second cutting blade edge. Consequently, the semiconductor devices 80 are separated into pieces.

Thereby, the chipping, the crack or the broken of the interlayer insulating film 4 by the blade dicing can be reduced remarkably. Moreover, since it is not necessary to make slow the number of rotations of the first cutting blade edge, the productivity in the blade dicing process does not fall. Moreover, the peeling off of the interlayer insulating film 4 by heat stress or the medicine damage in the sensor module manufacturing process can be suppressed remarkably.

In addition, although the embodiment is applied to the silicon wafer arranged on the glass substrate by the Face Down method, the embodiment is also applied to a case where a semiconductor element or an integrated circuit is formed on a silicon wafer, and the silicon wafer provided with a protection film on the surface is diced from the back surface of the wafer.

Second Embodiment

Figure 12:
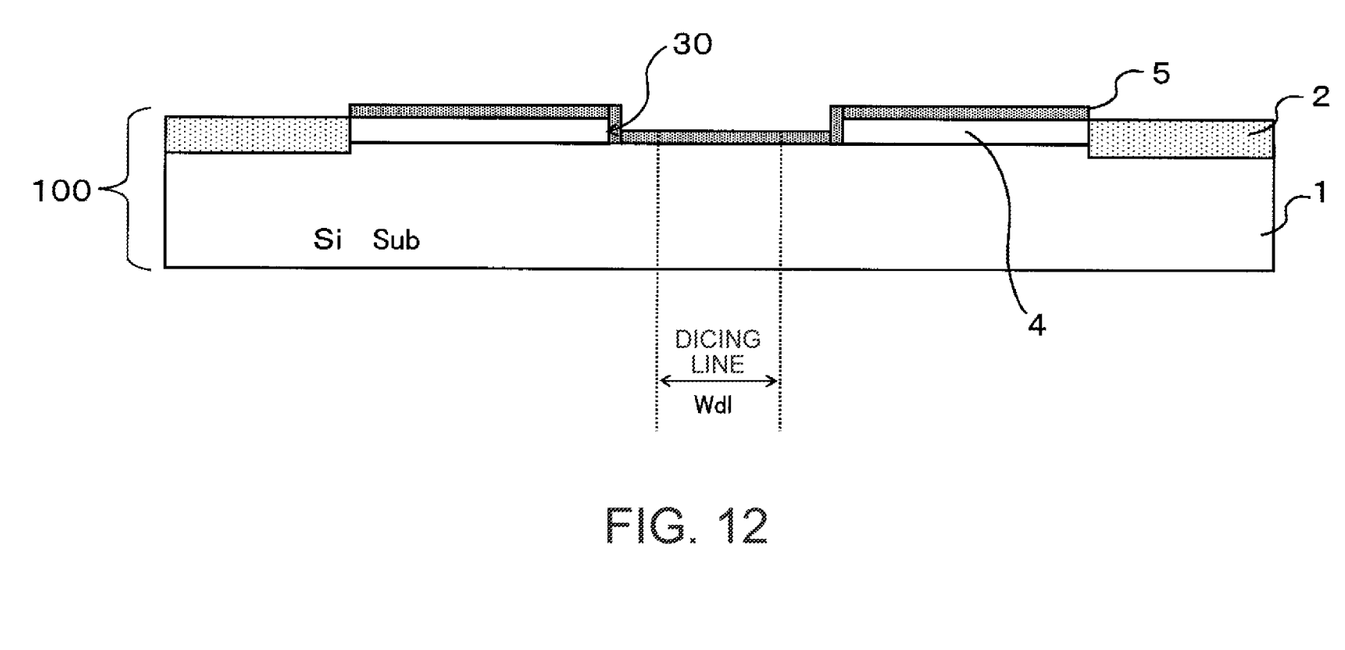
FIG. 12 and FIG. 13 are cross-sectional views showing a manufacturing process of a semiconductor device according to a second embodiment of the present invention.
Figure 13:
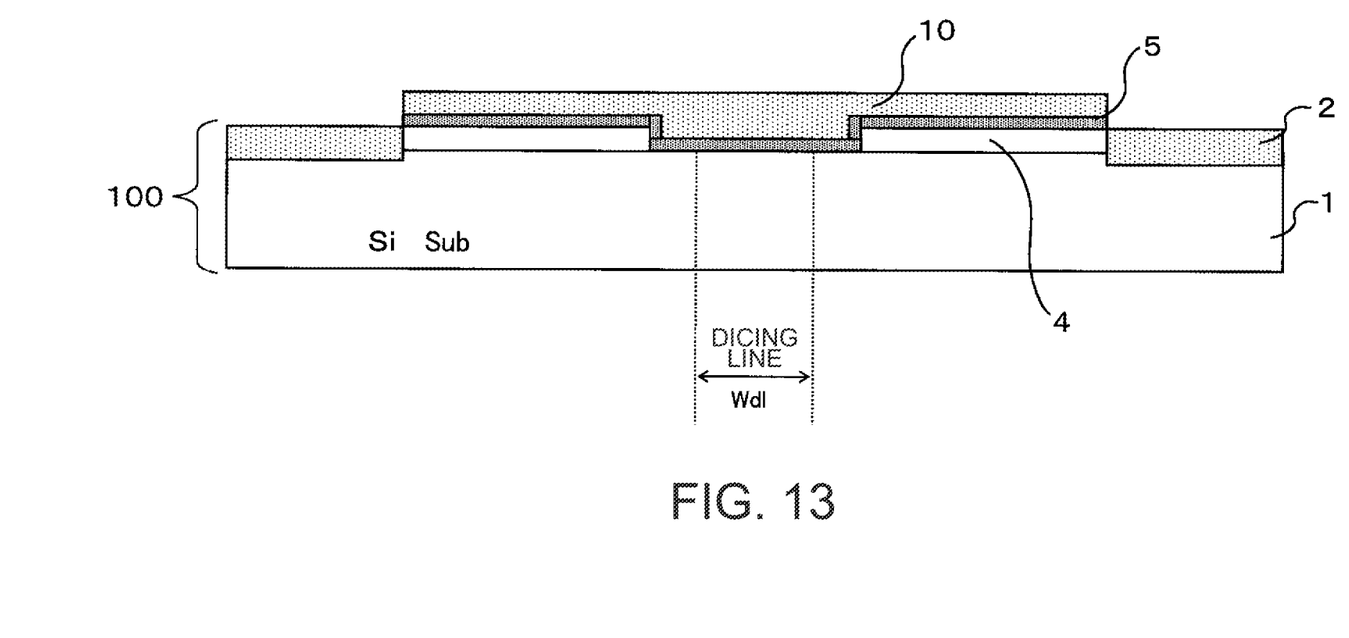

Next, a semiconductor device and a manufacturing method of the semiconductor device according to a second embodiment of the present invention are explained with reference to drawings. FIG. 12 and FIG. 13 are cross-sectional views showing the manufacturing process of the semiconductor device. In this embodiment, the shape of the resin layer 5 formed in the aperture is changed.

Hereafter, the same mark or symbol is given to the same portion as the first embodiment. The explanation about the same portion is omitted, and only a different portion is explained.

As shown in FIG. 12, the second embodiment uses the same process as the first embodiment till the process to form the aperture 30 in the silicon wafer 100 in which the CMOS type image sensor is formed ends. Next, the resin layer 5 is formed in the aperture 30 and on the interlayer insulating film 4. Here, the resin layer 5 is formed so as to cover the bottom and the both sides of the aperture 30 extending on the interlayer insulating film 4.

Then, as shown in FIG. 13, the adhesive layer 10 is formed on the resin layer 5. After this, since the process is the same as that of the first embodiment, illustration and explanation are omitted.

As mentioned above, in the semiconductor device and the manufacturing method of the semiconductor device according to this embodiment, when carrying out the blade dicing of the silicon wafer 100 adhered to the glass substrate 60 by the adhesive layer 10 like the first embodiment, the resin layer 5 is formed in the region in which the dicing is carried out, while the interlayer insulating film 4 is not formed.

For this reason, chipping, cracking or breakage of the interlayer insulating film 4 by the blade dicing can be reduced remarkably. Moreover, the peeling off of the interlayer insulating film 4 by the heat stress or the medicine damage in the sensor module manufacturing process can be also suppressed remarkably.

Third Embodiment

Figure 14:
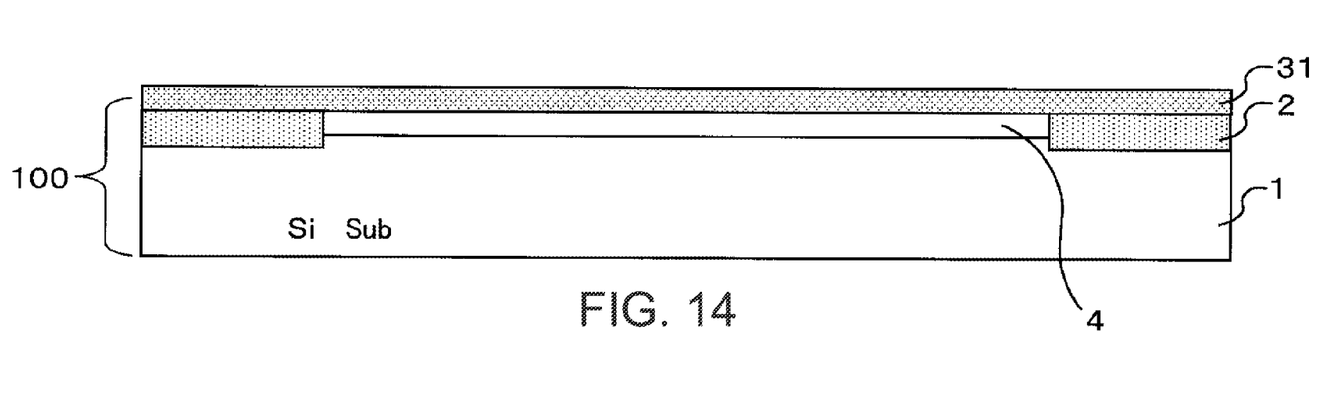
FIG. 14 and FIG. 15 are cross-sectional views showing a manufacturing process of a semiconductor device according to a third embodiment of the present invention.
Figure 15:
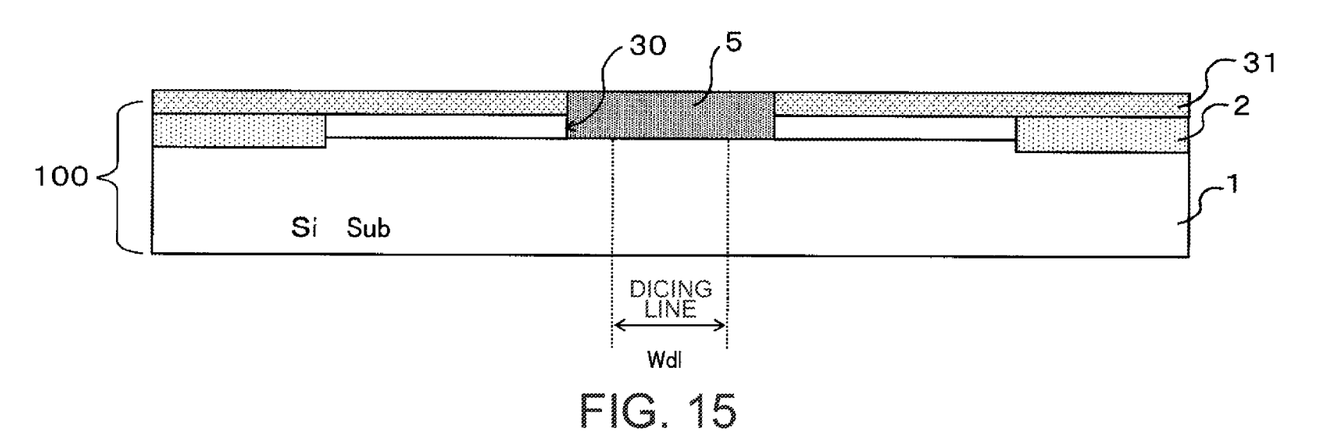

Next, the semiconductor device and the manufacturing method of the semiconductor device according to a third embodiment of the present invention are explained with reference to drawings. FIG. 14 and FIG. 15 are cross-sectional views showing the manufacturing process of the semiconductor device. In this embodiment, a color filter layer is formed on the semiconductor wafer before dicing.

Hereafter, the same mark or symbol is given to the identical configuration portion to the first embodiment and the explanation of the portion is omitted, and only a different portion is explained.

As shown in FIG. 14, the color filter film 31 is formed on the integrated circuit portion 2 and the interlayer insulating film 4 of the silicon wafer 100 in which the CMOS type image sensor is formed.

Next, as shown in FIG. 15, the color filter film 31 and the interlayer insulating film 4 are etched using the RIE method to form the aperture 30. The resin layer 5 is embedded in the aperture 30 after washing process by RIE. After this, since the process is the same as the first embodiment, the illustration and the explanation are omitted.

As mentioned above, in the semiconductor device and the manufacturing method of the semiconductor device according to this embodiment, when carrying out the blade dicing of the silicon wafer 100 adhered to the glass substrate 60 by the adhesive layer 10 like the first embodiment, the resin layer 5 is formed in the region in which the dicing is carried out, while the interlayer insulating film 4 is not formed.

For this reason chipping, cracking or breakage of the interlayer insulating film 4 by the blade dicing can be reduced remarkably. Moreover, the peeling off of the interlayer insulating film 4 by the heat stress or the medicine damage in the sensor module manufacturing process can be also suppressed remarkably.

Although the embodiments are applied to the blade dicing of the CMOS type image sensor device which uses the silicon substrate 1, they are also applicable to the blade dicing of general semiconductor devices using a SiC substrate or a GaAs substrate other than the CMOS type image sensor device using the silicon substrate 1.

While certain embodiments have been described, these embodiments have been presented by way of example only, and are not intended to limit the scope of the inventions. In practice, the structural and method elements can be modified without departing from the spirit of the invention. Various embodiments can be made by properly combining the structural and method elements disclosed in the embodiments. For example, some structural and method elements may be omitted from all the structural and method elements disclosed in the embodiments. Furthermore, the structural and method elements in different embodiments may properly be combined. The accompanying claims and their equivalents are intended to cover such forms or modifications as would fall with the scope and spirit of the inventions.

What is claimed is:

1. A semiconductor device having a semiconductor chip, the semiconductor chip comprising:
   an interlayer insulating film formed on a surface of a semiconductor substrate and having a dielectric constant smaller than a silicon oxide film ($SiO_2$);
   an aperture portion formed in the interlayer insulating film at an edge of the semiconductor chip apart from a semiconductor element portion;
   and a resin layer formed to be in contact with and to cover the aperture portion.

2. The semiconductor device according to claim 1, further comprising a glass substrate, wherein the face down semiconductor chip is adhered to the glass substrate.

3. The semiconductor device according to claim 1, wherein the semiconductor element portion includes an integrated circuit portion.

4. The semiconductor device according to claim 3, wherein the integrated circuit portion is arranged in a central portion of the chip.

5. The semiconductor device according to claim 4, wherein a light sensor portion is formed in the integrated circuit portion.

6. The semiconductor device according to claim 5, wherein a color filter layer is formed on the integrated circuit portion and the interlayer insulating film.

7. The semiconductor device according to claim 1, wherein the resin layer is formed of resin selected from the group consisting of polyimide resin, BCB (benzocyclobuten) resin and fluorine resin.

8. The semiconductor device according to claim 1, wherein the interlayer insulating film is selected from the group consisting of a SiOC film, a SiOCH film, and a porous (porosity) silica film.

9. The semiconductor device according to claim 1, further comprising a first surface electrode formed on the interlayer insulating film and a penetration hole penetrating the interlayer insulating film and the semiconductor substrate corresponding to the first surface electrode, wherein a penetration electrode is embedded in the penetration hole.

10. The semiconductor device according to claim 9, further comprising a second surface electrode formed on a second surface of the semiconductor substrate opposing to the first surface, wherein the penetration electrode is connected with the second surface electrode.

11. The semiconductor device according to claim 10 further comprising a ball terminal connected with the second surface electrode.

12. The semiconductor device according to claim 11, wherein the resin layer formed in the aperture portion extends to the interlayer insulating film.

13. The semiconductor device according to claim 12, wherein an adhesive layer is formed on the resin layer.

* * * * *